United States Patent [19]

Shimada et al.

[11] Patent Number: 5,699,610
[45] Date of Patent: Dec. 23, 1997

[54] PROCESS FOR CONNECTING ELECTRONIC DEVICES

[75] Inventors: Yuzo Shimada; Takayuki Suyama; Yoshimasa Tanaka; Shinichi Hasegawa, all of Tokyo, Japan

[73] Assignee: NEC Corporation, Tokyo, Japan

[21] Appl. No.: 474,019

[22] Filed: Jun. 7, 1995

Related U.S. Application Data

[63] Continuation-in-part of Ser. No. 423,455, Apr. 19, 1995.

[30] Foreign Application Priority Data

| Apr. 22, 1994 | [JP] | Japan | 6-083548 |
| Jun. 20, 1994 | [JP] | Japan | 6-137581 |
| Jul. 13, 1994 | [JP] | Japan | 6-161092 |
| Jul. 22, 1994 | [JP] | Japan | 6-170628 |

[51] Int. Cl.$^6$ .................................. H05K 13/34
[52] U.S. Cl. .................. 29/840; 29/852; 228/180.21
[58] Field of Search .................... 29/880, 852, 830; 228/180.21

[56] References Cited

U.S. PATENT DOCUMENTS

| 5,129,142 | 7/1992 | Bindra et al. | 29/852 |
| 5,218,761 | 6/1993 | Maniwa et al. | 29/852 |
| 5,261,155 | 11/1993 | Angulas et al. | |
| 5,317,801 | 6/1994 | Tanaka et al. | 29/852 X |

FOREIGN PATENT DOCUMENTS 1307236  12/1989  Japan.

OTHER PUBLICATIONS

R. Tummala et al.; "Microelectronics Packaging Handbook"; Van Nostrand Reinhold, 1989; pp. 209–219 and 422.

*Primary Examiner*—Carl J. Arbes
*Attorney, Agent, or Firm*—Whitham, Curtis, Whitham & McGinn

[57] ABSTRACT

In a first step, a first substrate is prepared. The first substrate has a first surface, a second surface, and a through-hole therebetween. In a second step, a second substrate is prepared. The second substrate has a first surface, a second surface, and a pad on the first surface of the second substrate. In a third step, a solder is provided on the pad of the second substrate. In a fourth step, the through-hole of the first substrate is positioned on the solder. The second surface of the first substrate and the first surface of the second substrate face each other. In a fifth step, the solder is heated to flow the solder into the through-hole of the first substrate. In the sixth step, an appearance of the solder on the first surface of the first substrate may be confirmed for detection of a connection of the solder.

14 Claims, 19 Drawing Sheets

PROCESS FOR CONNECTING ELECTRONIC DEVICES

CROSS-REFERENCE TO RELATED APPLICATIONS

The present application is a Continuation-in-Part of U.S. patent application Ser. No. 08/423,455, filed on Apr. 19, 1995.

BACKGROUND OF THE INVENTION

The present invention relates to a member for supporting cooling means and an electronic package using the same, and more particularly to an electronic package using the supporting member and a tape carrier.

A "tape carrier" refers to a flexible connecting structure comprising a wiring to be connected to an electronic device and an insulating film supporting the wiring. The tape carrier includes tape automated bonding (TAB) films.

An "electronic package" refers to electrical components assembled as a unit. The electronic package may, but does not necessarily, comprise a cell encapsulating the electrical components.

"Cooling means" refers to a device for absorbing and dissipating heat generated from an electric device. The cooling means may include heat sinks and/or liquid cooling modules. Examples of cooling means are disclosed in Rao R. Tummala and Eugene J. Rymaszewski, "Micro Electronics Packaging Handbook", Van Nostrand Reinhold, New York, pp.209–219.

A conventional electronic package including cooling means and a tape carrier is disclosed in FIG. 6–50 on p. 422 of the aforementioned reference.

This conventional electronic package has a heat sink as the cooling means. The heat sink is attached to the upper face of a large-scale integrated circuit (LSI). The lower face of the LSI is connected to inner leads of a tape carrier. Outer leads of the tape carrier are connected to a substrate.

Nowadays, the conventional electronic package is widely used for dissipating heat the amount of which is increased by high-density and high-speed designs of LSIs.

A conventional connecting structure between a flexible circuitized substrate and a printed substrate is disclosed in U.S. Pat. No. 5,261,155.

In this conventional connecting structure, the flexible substrate and printed substrate are connected by a solder ball provided therebetween, instead of outer leads of the flexible substrate.

However, the conventional package has the following problems.

First, the heat sink presses the LSI toward the substrate. Thus, the LSI is sandwiched between the heat sink and the substrate and may be damaged.

Secondly, the weight of the heat sink produces a mechanical stress in the tape carrier. Thus, connection between the tape carrier and the substrate may be damaged by the stress.

Thirdly, a process for assembling the conventional package must include a step of squeezing glue between the heat sink and the substrate so that the thickness of the glue becomes thin. The squeezing step is indispensable because thermal resistance between the heat sink and the LSI greatly depends on the thickness of the glue. In fact, the electronic package is set aside at room temperature for several days with the glue squeezed between the heat sink and the substrate.

Fourthly, great care must be taken for precisely positioning the terminals of the tape carrier over the corresponding terminals of the substrate. This problem is serious when the conventional connecting structure is applied in the conventional package because the terminals are obscured under the tape carrier.

The conventional connecting structure also has a problem that a faulty or failed connection is not easily detected because the solder is obscured under the flexible substrate.

SUMMARY OF THE INVENTION

In view of the above problems of the conventional package and the conventional connecting structure, an object of the present invention is to provide a connecting process in which a faulty or failed connection can easily be detected.

In a process for connecting electronic devices according to the present invention, in a first step, a first substrate is prepared. The first substrate has a first surface, a second surface, and a through-hole therebetween. In a second step, a second substrate is prepared. The second substrate has a first surface, a second surface, and a pad on the first surface of the second substrate. In a third step, a solder is provided on the pad of the second substrate. In a fourth step, the through-hole of the first substrate is positioned on the solder. The second surface of the first substrate and the first surface of the second substrate faces each other. In a fifth step, the solder is heated to flow the solder into the through-hole of the first substrate.

In the aforementioned process, an appearance of the solder on the first surface of the first substrate may be confirmed for detection of a connection of the solder. That is, in this step is confirmed whether at least a portion of the solder is protruding from the through-hole of the first substrate.

BRIEF DESCRIPTION OF THE DRAWINGS

Other objects, features and advantages of the present invention will become more apparent when the following description is read in conjunction with the accompanying drawings, wherein.

In these drawings, the same reference numerals depict the same parts, respectively.

DETAILED DESCRIPTION OF THE PREFERRED EMBODIMENTS

Next is described the structure of a supporting member 10 according to the first embodiment of the present invention.

Figure 1:
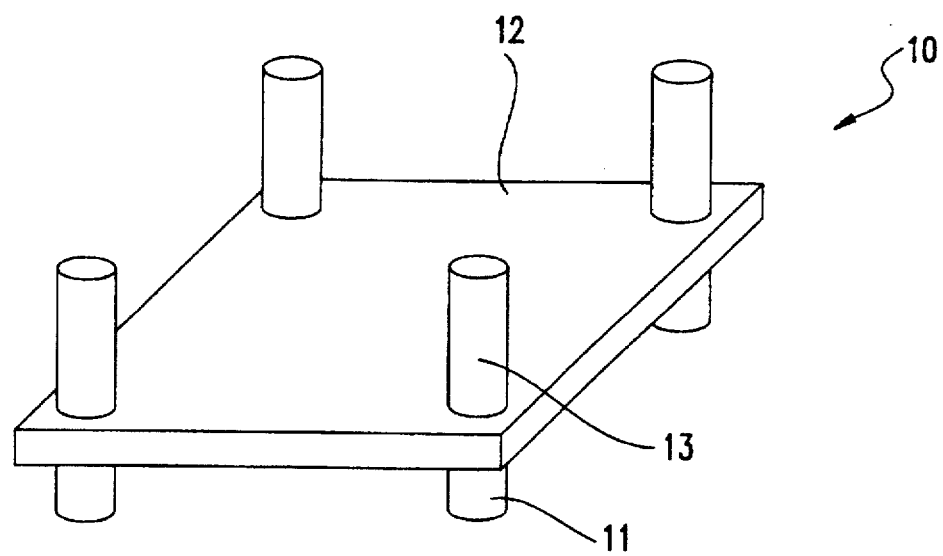
FIG. 1 is a perspective view of a supporting member 10 according to a first embodiment of the present invention.

Referring to FIG. 1, supporting member 10 comprises a square plate 12 whose sides and thickness are about 22 mm and 1–2 mm, respectively. The plate 12 serves as a heat sink or a heat radiating plate. The plate 12 has four bottom legs 11 at each corner of its lower surface. The plate 12 also has four upper legs 13 at each corner of its upper surface.

The plate 12 is made of a material with a relatively high thermal conductivity. Specifically, the plate 12 is preferably made of a copper-tungsten alloy, whose thermal conductivity and thermal expansion coefficient are 180 W/mk and $6.5 \times 10^{-6}$, respectively. Copper-Kovar alloy, Copper-Mo alloy and copper can also be used as the material of the plate 12. Kovar is an alloy of iron, nickel and cobalt. The plate 12 can also be made of a ceramic with a relatively high thermal conductivity such as AlN.

Cooling means (e.g., a heat sink) and an electronic device (e.g., a large-scale integrated circuit) are respectively attached to the upper and lower surface of the plate 12.

The bottom legs 11 are shaped as a cylindrical column whose diameter and height are approximately 1.6–1.7 mm and 0.8 mm, respectively. The upper ends of the bottom legs 11 are connected to the lower surface of the plate 12. The bottom legs 11 are preferably made of brass. The height of the bottom legs 11 is set so that the electronic device is not pressed against a substrate by the cooling means when the supporting member 10 is placed on the substrate. Preferably, the height of the bottom legs 11 is greater than the thickness of the electronic device.

The upper legs 13 are shaped as a cylindrical column whose diameter and height are approximately 1.0 mm and 4.0 mm, respectively. The lower ends of the upper legs 13 are connected to the upper surface of the plate 12. The upper legs 13 are preferably made of brass. The upper portion of the upper leg 13 is threaded.

The supporting member 10 may be prepared by the following methods. A first method includes cutting a material body to form the bottom legs 11, plate 12, and the upper legs 13. A second method includes soldering the upper legs 13 and the bottom legs 11 to the plate 12. A third method includes boring through-holes in the plate 12 and inserting pins into the thorough-holes. Then, the pins are soldered to the plate 12. The portion of the pin protruding from the upper and lower faces of the plate 12 serves as the upper legs 13 and bottom legs 11, respectively.

Figure 2:
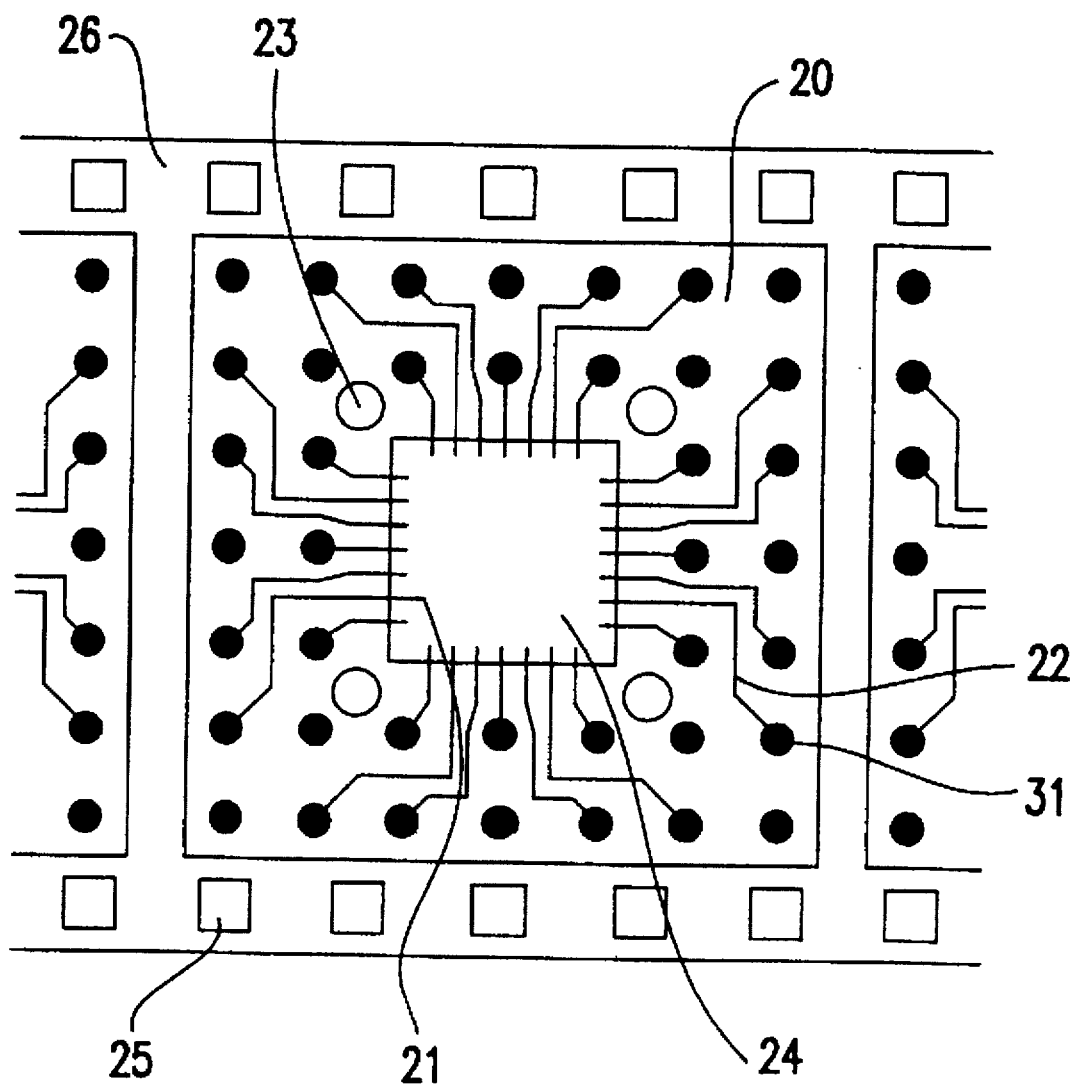
FIG. 2 shows the structure of a tape carrier 20 of the first embodiment the present invention.

Referring to FIG. 2, a tape carrier 20 which is used with the supporting member 10 includes a film 26.

The thickness of the film 26 is about 50 μm. The film 26 is made of an organic insulating resin with heat resistance and a low thermal expansion coefficient. The film 26 is preferably made of a material which is easily attachable to wirings 22 thereonto. Specifically, the film 26 is made of a polyimide. Fluororesins and epoxy resins can also be used as the material of the film 26.

The film 26 has circular holes 23 for receiving the bottom legs 11 of the supporting member 10. The holes 23 are shaped so as to fit to the bottom legs 11. In the first embodiment, the diameter of the holes 23 is 1.8 mm.

The film 26 has a device hole 24 for receiving an electronic device (e.g., an LSI). In this exemplary embodiment, the device hole 24 is shaped as a square whose side is about 18.0 mm. However, the hole 24 can be formed to have any shape so as to correspond to the shape of the LSI.

The tape carrier 20 has inner leads 21 protruding into the device hole 24. In the exemplary embodiment, the number of the inner leads 21 is about 800. The inner leads 21 are aligned with an 80 μm pitch. The inner leads 21 are connected to pads 31 via the wirings 21. The pads 31 are disposed in a grid pattern. The inner leads 21, the wirings 22, and the pads 31 are formed on the lower surface of the tape carrier 20.

The tape carriers 20 of the first embodiment are formed in a tape automated bonding (TAB) tape which includes sequentially provided tape carriers 20. Each tape carrier 20 occupies an area of 43 mm×43 mm. Holes 25 are formed along both sides of the TAB tape. The tape carriers 20 are moved by rotating a sprocket wheel by fitting the teeth of the sprocket wheel into the holes 25.

Figure 3:
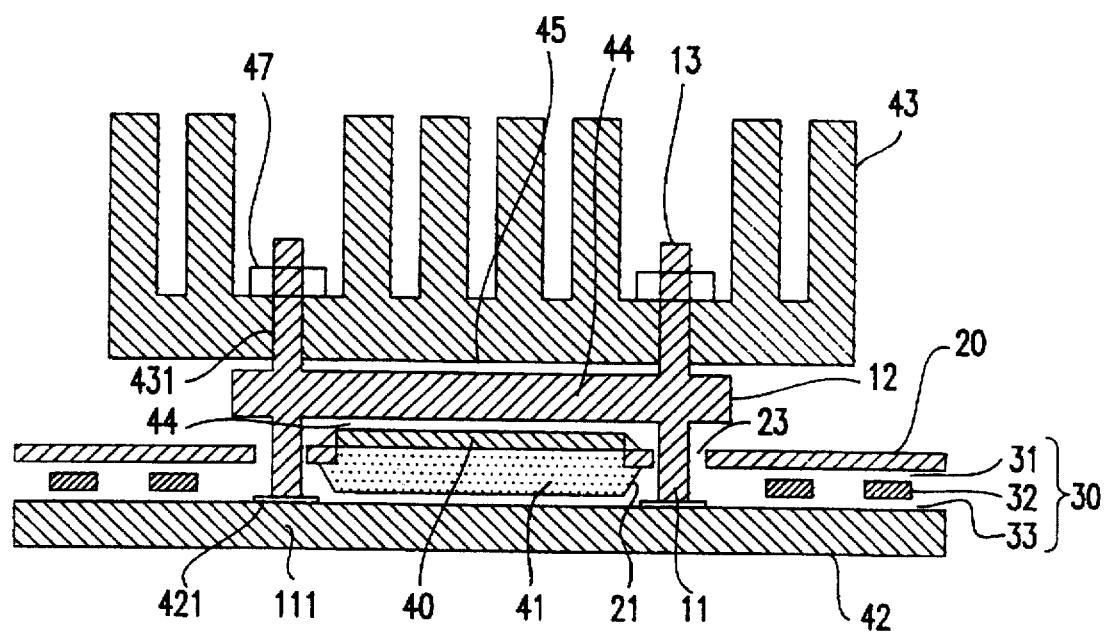
FIG. 3 shows the structure of an electronic package according to the first embodiment of the present invention.

Referring to FIG. 3, an electronic package using the supporting member 10 includes LSI chip 40 of 17.5 mm×17.5 mm. An integrated circuit is formed in the lower surface of the LSI 40. The LSI chip 40 has about 800 input/output terminals (not shown) on the lower surface thereof. The terminals are aligned with about an 80 μm pitch. The terminals of the LSI chip 40 are connected to the inner leads 21 of the tape carrier 20. The LSI chip 40 is received into the device hole 24 of the tape carrier 20. The lower surface of the LSI chip 40 and the inner leads 21 of the tape carrier 20 are encapsulated in a resin 41.

The bottom legs 11 of the supporting member 10 are inserted into the holes 23 of the tape carrier 20. The upper surface of the LSI chip 40 is attached (e.g., glued) to the lower face of the plate 12 of the supporting member 10 by an adhesive 44. The adhesive 44 is preferably an epoxy-type adhesive including silver powder as a filler. Au/Sn-type solders can be used as the adhesive 44 instead of resins. When the LSI chip 40 is attached by a solder, a layer of Ti/Au or Ni is formed on the upper surface of the LSI chip 40 and the lower face of the plate 12.

The bottom legs 11 are connected (e.g., soldered by solder 111) to pads 421 on a substrate 42. Any type of substrate can be used as the substrate 42. Among the substrates used as the substrate 42 are glass epoxy substrates, polyimide substrates, and ceramic substrates.

Pads 33 are formed on the upper face of the substrate 42. The pads 33 are connected to the pads 31 of the tape carrier 20 via solder bumps 32. The pads 31, the solder bumps 32, and the pads 33 form a connecting structure 30.

A heat sink 43 is attached to the upper face of the plate 12 of the supporting member 10. The upper legs 13 of the supporting member 10 are inserted into holes 431 bored in the heat sink 43. The threaded upper portions of the upper legs 13 protrude through the upper face of the heat sink 43. Suitable fasteners (e.g., nuts) 47 are screwed onto the upper portion of the upper legs 13 to secure the heat sink 43 to the supporting member 10. A silicone-type adhesive 45 is provided between the lower face of the heat sink 43 and the upper face of the plate 12 of the supporting member 10.

The length between the upper surface of the LSI chip 40 and the lower surface of the resin 41 is about 0.75 mm. Specifically, the thicknesses of the LSI chip 40 and the resin 41 are 0.45 mm and 0.3 mm, respectively. The resin 41 is kept from contacting the substrate 42. Thus, the LSI chip 40 is not pressed against the substrate 42 by the weight of the heat sink 43. The weight of the heat sink 43 does not produce stress in the tape carrier 20. Further, the tape carrier 20 is not loosened or pulled off from the substrate 42 by the heat sink 43 when the substrate 42 is in an upright position.

Next is described the assembling process of the electronic package of the first embodiment.

Figure 4A:
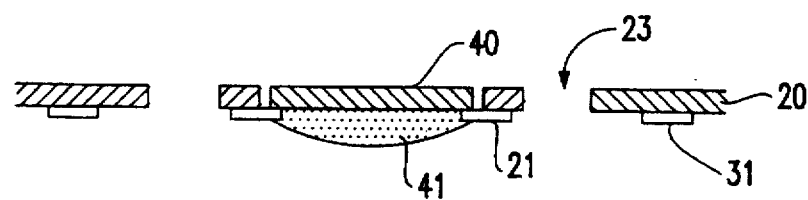
FIGS. 4(a)–4(d) illustrate steps of the assembling process of the electronic package shown in FIG. 3.

Referring to FIG. 4(a), in step 1, the terminals of the LSI chip 40 are connected to the inner leads 21 of the tape carrier 20. Thereafter, the lower surface of the LSI chip 40 and the inner leads 21 are encapsulated in the resin 41.

Figure 4B:
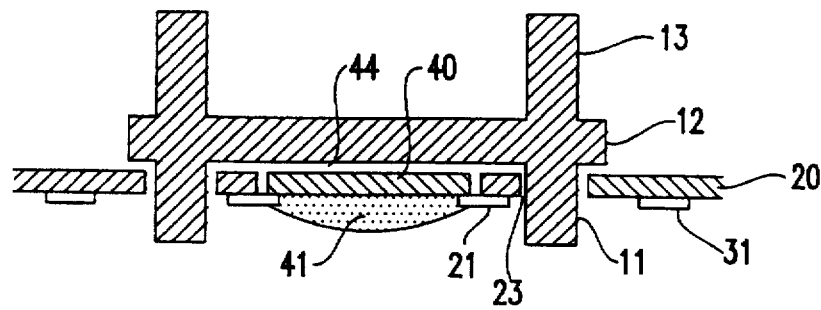

Referring to FIG. 4(b), in step 2, the adhesive 44 is uniformly distributed over the upper surface of the LSI chip 40 or the lower face of the plate 12. Thereafter, the LSI chip 40 is attached to the lower face of the plate 12 of the supporting member 10. The bottom legs 11 of the supporting member 10 are inserted into the holes 23 of the tape carrier 20.

Figure 4C:
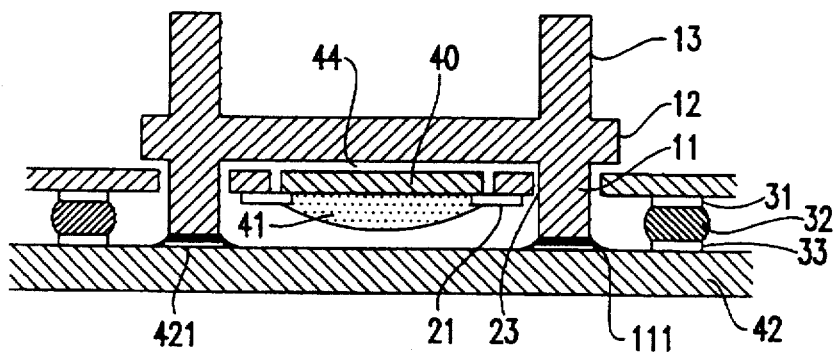

Referring to FIG. 4(c), in step 3, the supporting member is positioned such that the bottom legs 11 are positioned on the pads 421. Positioning of the supporting member 10 also positions each of the pads 31 above the corresponding one of the pads 33.

The solder bumps 32 are preformed on the pads 33 of the substrate 42. The solder 111 is pre-applied on the pads 421 of the substrate 42. After the positioning of the supporting member 10, the solder bumps 32 and the solder 111 are heated to connect between the pads 31 and pads 33, and between the bottom legs 11 and the pads 421, respectively.

Figure 4D:
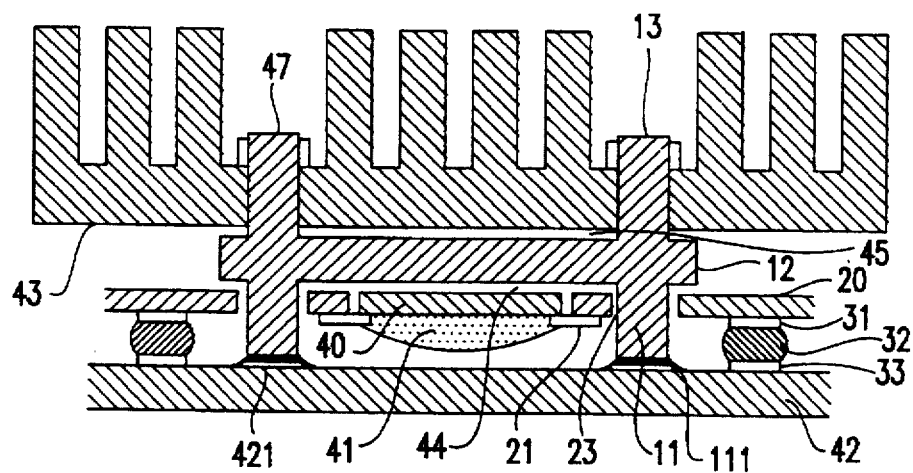

Referring to FIG. 4(d), in step 4, the adhesive 45 is uniformly distributed over the upper face of the plate 12 or the lower face of the heat sink 43. Thereafter, the heat sink 43 is positioned on the plate 12. The upper legs 13 of the supporting member 10 are inserted into the holes 431 (unreferenced in FIG. 4(d)) of the heat sink 43. The nuts 47 press the heat sink 43 against the plate 12 to secure the heat sink 43 on the plate 12. The heat sink 43 squeezes the adhesive 45 to uniformly distribute and make the adhesive 45 thinner. The adhesion of the adhesive 45 takes about 24 hours and 15 minutes at room temperature and at a temperature of 150° C., respectively.

In the aforementioned assembling process, positioning of the tape carrier 20 as in the conventional processes is unnecessary because the positioning of the supporting member 10 simultaneously and precisely positions the tape carrier 20 into a predetermined position.

Further, aforementioned assembling process does not include a step for squeezing the adhesive 45 because the nuts 47 press the heat sink 43 against the plate 12 to thereby squeeze the adhesive 45.

Next is described the second embodiment of the present invention. The second embodiment has several features. A first feature is forming the bottom legs 11 and upper legs 13 of the supporting member 10 by inserting pins into the plate 12. Another feature is adopting a novel connecting structure for the connection between the tape carrier 20 and the substrate 42.

Figure 5:
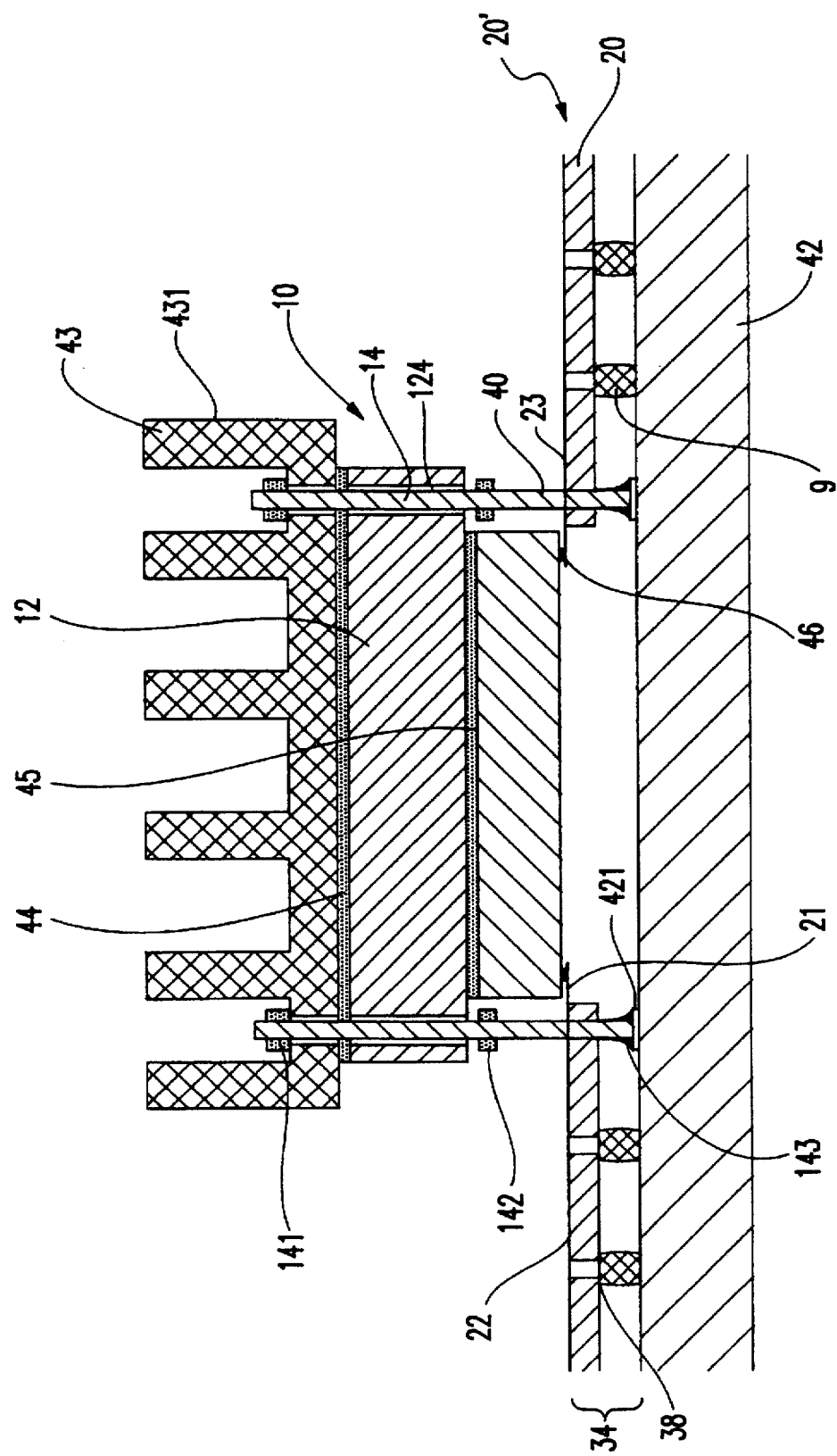
FIG. 5 shows the structure of an electronic package according to a second embodiment of the present invention.

Referring to FIG. 5, a supporting member 10 of the second embodiment includes four pins 14. The pins 14 are shaped as cylindrical columns whose diameter is approximately 1.0 mm. The pins 14 are preferably made of brass or Kovar. The pins 14 are preferably plated with nickel. The lower ends of the pins 14 are connected (e.g., soldered by the solder 143) to the pads 421 on the substrate 42. The solder 143 is preferably Sn 63 wt %–Pb 37 wt % eutectic solder. The pins 14 are threaded to receive nuts 142.

The LSI 40 is connected to the inner leads 21 of the tape carrier 20'. The pins 14 are inserted into the holes 23 of the tape carrier 20'. The tape carrier 20' is connected to the substrate 42 via a connecting structure 34. The detailed structures of the tape carrier 20' and the connecting structure 34 are described below.

The size of the plate 12 is preset so that the plate 12 does not cover the connecting structure 34. In the second embodiment, the plate 12 is preferably a square whose sides and thickness are approximately 22 mm and 1–2 mm, respectively. The plate 12 has through-holes 124 at each corner. The pins 14 are inserted into the holes 124. The plate 12 is supported by the nuts 142. The LSI chip 40 is attached (e.g., glued) to the lower face of the plate 12.

The heat sink 43 is attached (e.g., glued) to the upper face of the plate 12. The upper portions of the pins 14 are inserted into the holes 431 of the heat sink 43. The heat sink 43 is secured by the nuts 141. The plate 12 and the heat sink 43 are securely held between the nuts 142 and the nuts 141.

The material of the plate 12 is the same as that of the first embodiment.

Next is described the structure of the tape carrier 20' and the connecting structure 34.

Figure 6:
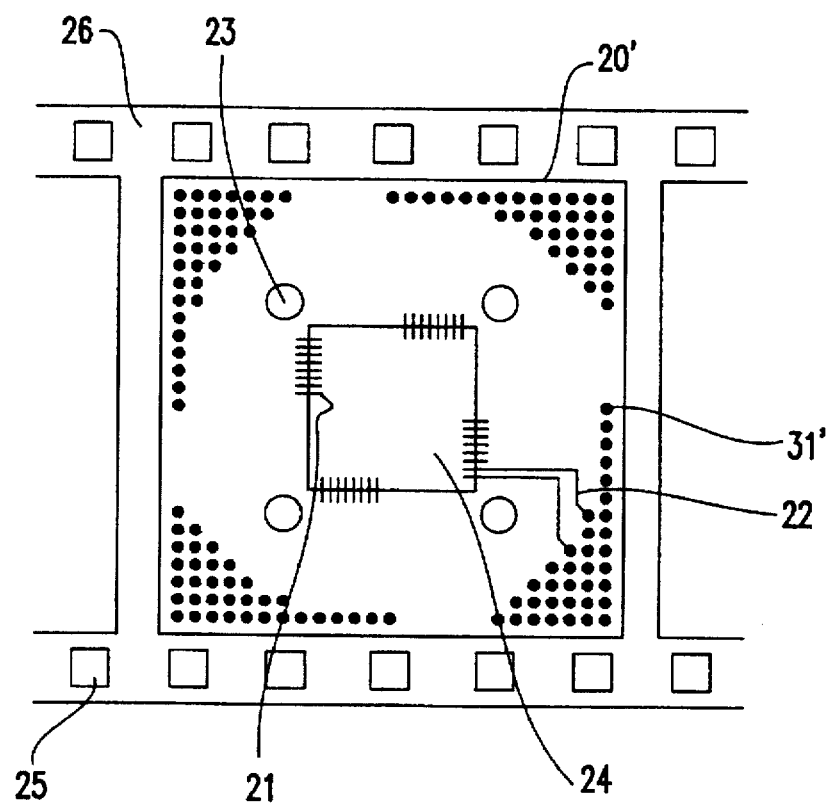
FIG. 6 shows the structure of a tape carrier 20' of the second embodiment of the present invention.

Referring to FIG. 6, the inner leads 21 and the wirings 22 are formed on the upper surface of the tape carrier 20'. One end of each of the wirings 22 is connected to one of the inner leads 21. The other end of each of the wirings 22 is connected to one of the pads 31'.

The wirings are preferably made of copper plated with gold. The width and the thickness of the wirings are approximately 40 µm and 10–25 µm, respectively. The pads 31' are disposed in a grid pattern with approximately a 1.27 mm pitch. The detailed structure of the pads 31' is described below.

In the second embodiment, the diameter of the holes 23 of the tape carrier 20' is set to approximately 1.1 mm to match the pins 14. The material of the film 26 and the size of the device hole 24 are the same as those of the first embodiment.

Next is described the structure of the pads 31'.

Figure 7A:
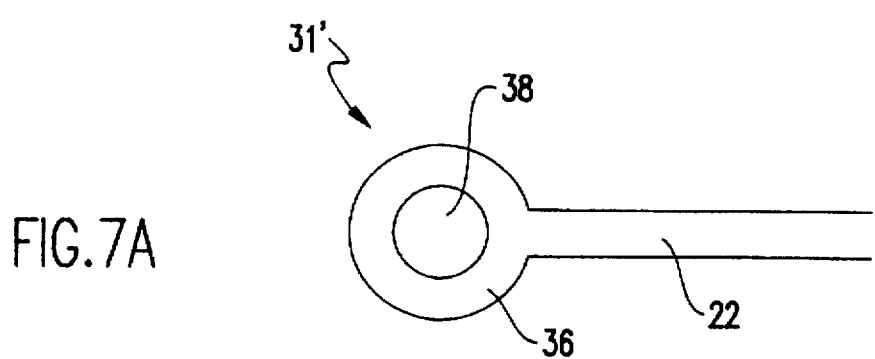
FIGS. 7(a) and 7(b) show the detailed structure of a pad 31' shown in FIG. 6.
Figure 7B:
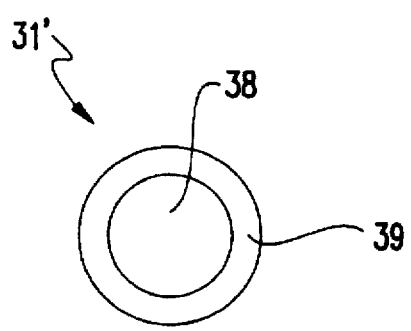

Referring to FIGS. 7(a) and 7(b), each of the pads 31' includes annular conductor patterns 36 and 39 on the upper and lower surface of the tape carrier 20', respectively. The outer diameters of the conductor patterns 36 and 39 are approximately 250 µm and 600 µm, respectively. The wirings 22 are connected to the conductor pattern 36.

Figure 8A:
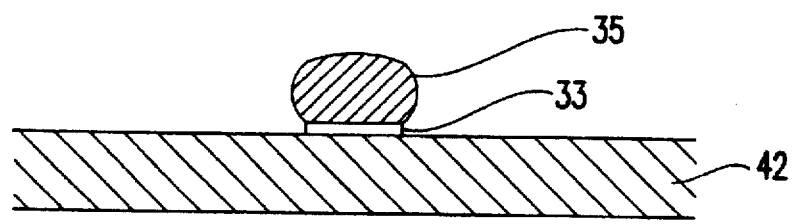
FIGS. 8(a)–8(c) illustrate steps of a process for connecting the pad 31' of the tape carrier 20 and a pad 33 of a substrate 42.
Figure 8B:
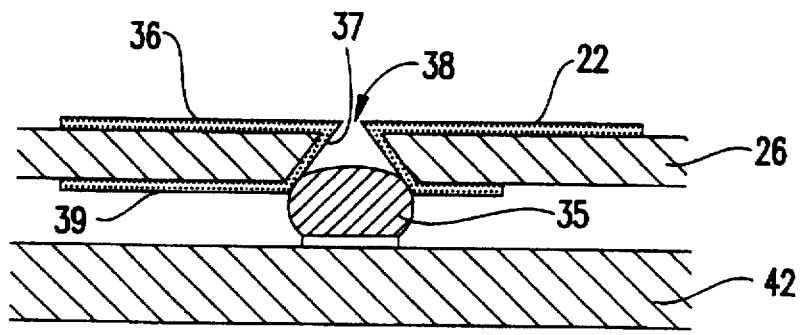

Referring to FIG. 8(b), each of the pads 31' further includes a through-hole 38 which is formed in the film 26.

The diameter of the through-hole 38 is set to approximately 150 µm and 300 µm at the upper and lower surfaces of the film 26, respectively, thereby tapering the through-hole 38. The advantages of such a tapered through-hole 38 are described below. Another conductor pattern 37 is formed on the inner surface of the through-hole 38. The conductor pattern 37 connects the conductor patterns 36 and 39.

The conductor patterns 36, 37, and 39 are preferably made of copper plated with gold. The thickness of the conductor patterns is approximately 20 µm.

Next is described the process for connecting the pads 31' of the tape carrier 20' and the pads 33 of the substrate 42.

Referring to FIG. 8(a), in step 1, solder 35 is applied onto the pads 33 of the substrate 42. The solder 35 is preferably Sn 63 wt %–Pb 37 wt % eutectic solder. The height and the volume of the solder 35 are approximately 300 µm and $0.6 \times 10^{-10} m^3$, respectively.

Referring to FIG. 8(b), in step 2, the pad 31' of the tape carrier 20' is a positioned above the pad 33 of the substrate 42.

Figure 8C:
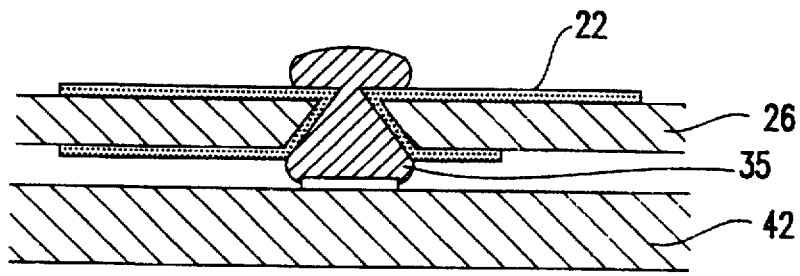

Referring to FIG. 8(c), in step 3, the solder 35 is heated to approximately 200° C.–250° C. By heating, the solder 35 melts to travel or flow upwardly into the through-hole 38 by channeling. The solder 35 that thus flows appears on the upper surface of the tape carrier 20' and is readily observable.

Next is described how a faulty or failed connection of the connecting structure 34 is detected. If the solder 35 appears on the upper surface of the tape carrier 20', the connection is determined to be completed. However, if the solder 35 is absent, the connection may be faulty or completely failed. Thus, the connection failure in the connecting structure 34 can be detected easily since the lack of solder 35 on the tape carrier 20' can be easily identified.

Thus, in addition to the features of the first embodiment, the second embodiment allows a faulty or failed connection between the tape carrier 20 and the substrate 42 to be easily detected.

Next is described a third embodiment of the present invention. The feature of the third embodiment is a modification of the means for supporting the plate 12. Other structures and functions of the third embodiment are the same or similar to those of the first embodiment.

Figure 9:
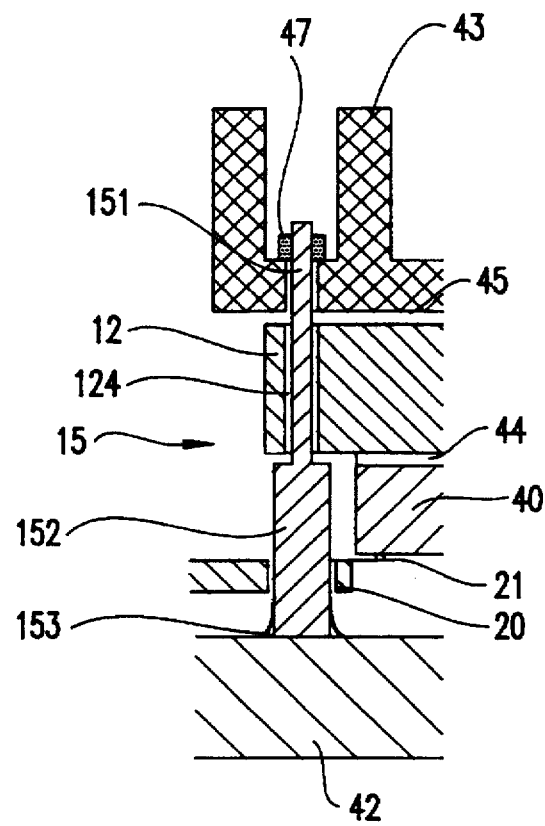
FIG. 9 shows the structure of an electronic package according to a third embodiment of the present invention.

Referring to FIG. 9, in the third embodiment, each of pins is have first and second portions. The diameters of the first portion 151 and the second portion 152 are approximately 1.0 mm and 1.6 mm, respectively. The length of the second portion 152 is approximately 1.8 mm. The diameter of the holes 124 of the plate 12 and the holes 23 of the tape carrier 20' are set to approximately 1.4 mm and 1.8 mm, respectively. The first portion 151 can be inserted into the holes 124 of the plate 12, while the second portion 152 cannot be inserted thereinto. The plate 12 is supported on the second portions 152 of the pins 15.

The lower ends of the second portions 152 are joined to the substrate 42 by solder 153. In the third embodiment, the substrate 42 and solder 153 are preferably a ceramic substrate and a Au-Sn type solder, respectively. The soldering of the solder 153 is performed at a temperature of approximately 350° C.

Thus, in addition to the features of the second embodiment, the third embodiment has several features. A first feature is that the nuts 142 are eliminated. Another feature is that the length of the gap between the substrate 42 and the plate 12 can be set precisely.

Next is described the assembling process of the third embodiment.

Figure 10A:
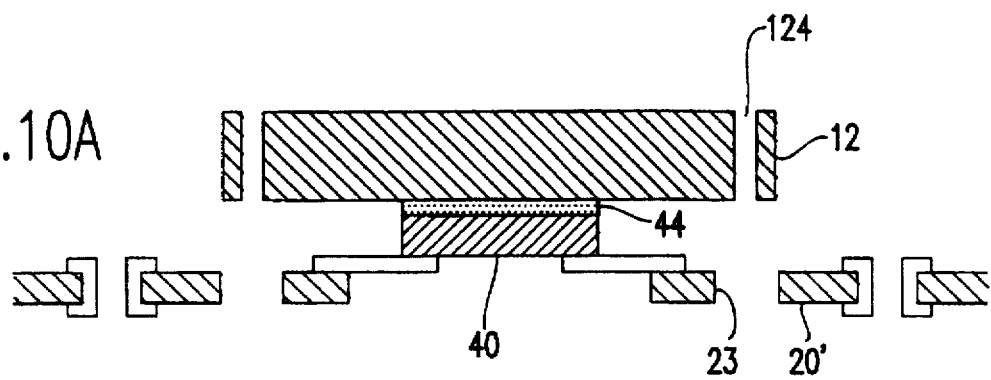
FIGS. 10(a)–10(c) illustrate steps of the assembling process of the electronic package shown in FIG. 9.

Referring to FIG. 10(a), in step 1, the LSI chip 40, which is connected to the tape carrier 20', is attached to the lower surface of the plate 12 by the adhesive 44.

Figure 10B:
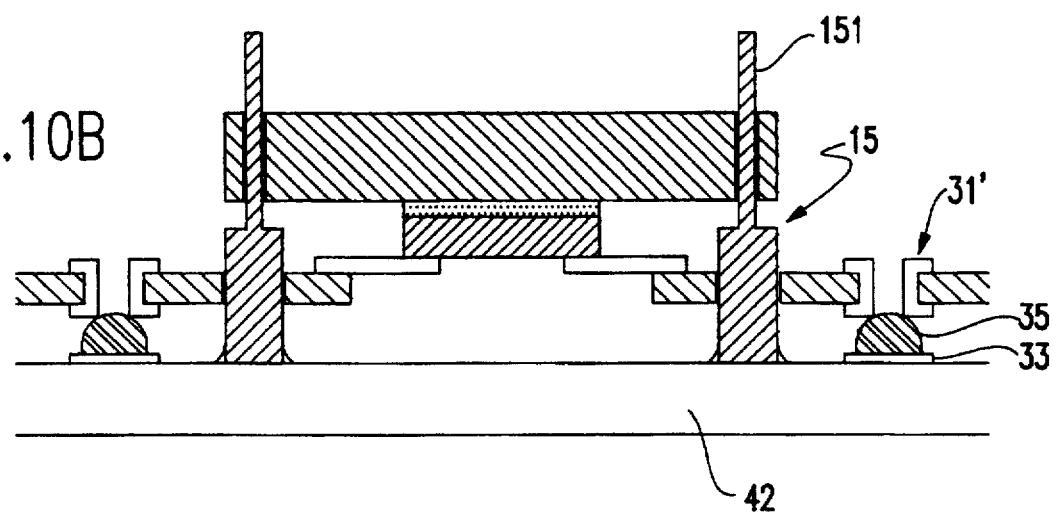

Referring to FIG. 10(b), in step 2, the pins 15 are inserted into the respective holes 23 of the tape carrier 20' and into the respective holes 124 of the plate 12. The pins 15 are pre-joined to the substrate 42. By inserting the pins 15 into the holes 23, each of the pads 31' is positioned over the corresponding one of the pads 33.

Figure 10C:
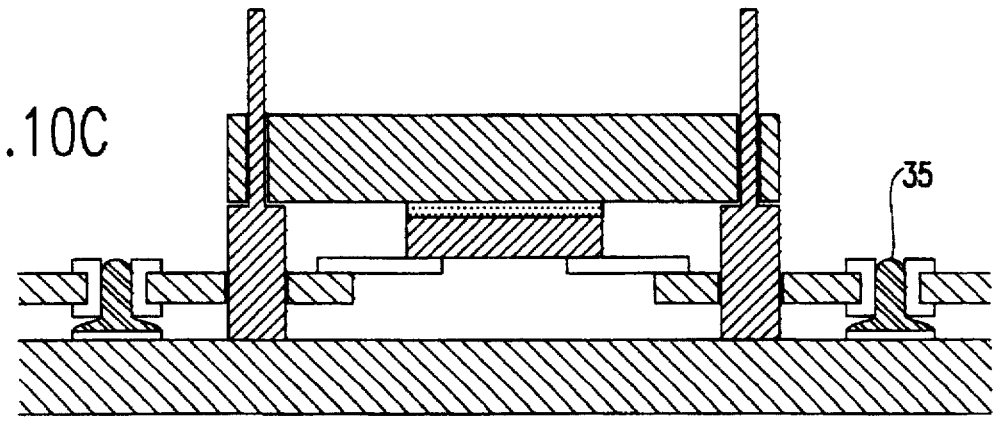

Referring to FIG. 10(c), in step 3, the pads 31' and the pads 33 are joined via solder 35 by the process shown in FIGS. 8(a)–8(c). A good connection is detected by the appearance of the solder 35 at the upper surface of the tape carrier 20'.

Figure 11:
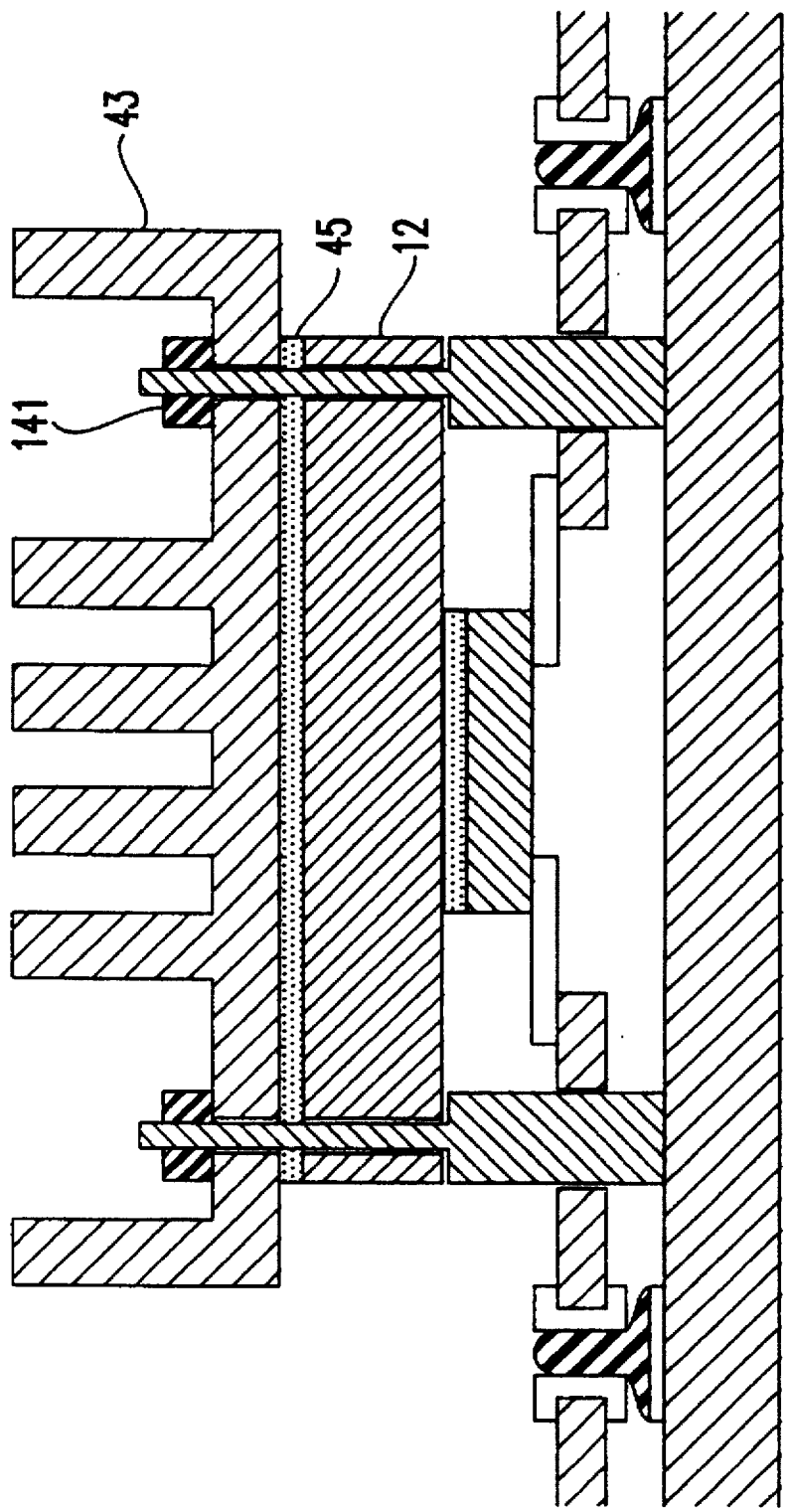
FIG. 11 illustrates a step of the assembling process of the electronic package shown in FIG. 9.

Referring to FIG. 11, in step 4, the heat sink 43 is secured to the plate 12 by the nuts 141. The adhesive 45 is provided between the plate 12 and the heat sink 43. By securing the nuts 141, the adhesive 45 is squeezed to become uniformly distributed and to have a smaller thickness.

Next is described the fourth embodiment of the present invention. A feature of the fourth embodiment is a modification of the means for joining the bottom legs 11 or pins to the substrate 42. Other structures and functions of the fourth embodiment are the same or similar to those of the third embodiment.

Figure 12:
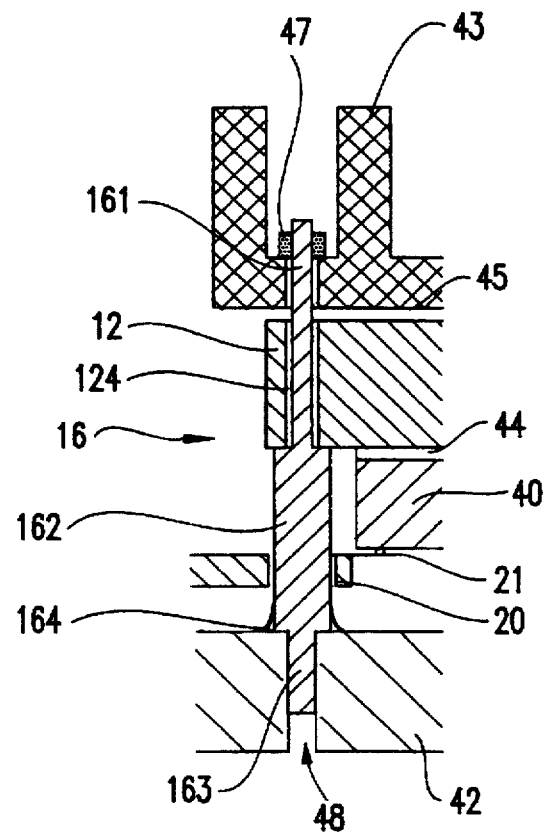
FIG. 12 shows the structure of an electronic package according to a fourth embodiment of the present invention.

Referring to FIG. 12, pins 16 have first, second, and third portions 161–163, respectively. The structures of the first and second portions are the same as those of the third embodiment. The diameter of the third portions of the pins 16 is approximately 0.8 mm. The third portion is plated with nickel.

In the fourth embodiment, the substrate 42 is preferably a glass polyimide-type printed circuit board which is heat resistant and has a low permitivity. In the substrate 42, holes 48 are bored having a 0.8 mm diameter. The third portions 163 of the pins 16 are inserted into the holes 48 and joined to the substrate 42 via solder 164. The solder 164 flows into the gap between the holes 48 and the pins 16.

Thus, in addition to the features of the third embodiment, the fourth embodiment has the following features. A first feature is that the pins 16 are positioned precisely. Another feature is that the strength of the joint between the pins 16 and the substrate 42 is enhanced.

Next is described the fifth embodiment of the present invention. A feature of the fifth embodiment is a modification of the means for joining the lower legs 11 or pins to the substrate 42. The other structures and functions are the same or similar to those of the third embodiment.

Figure 13:
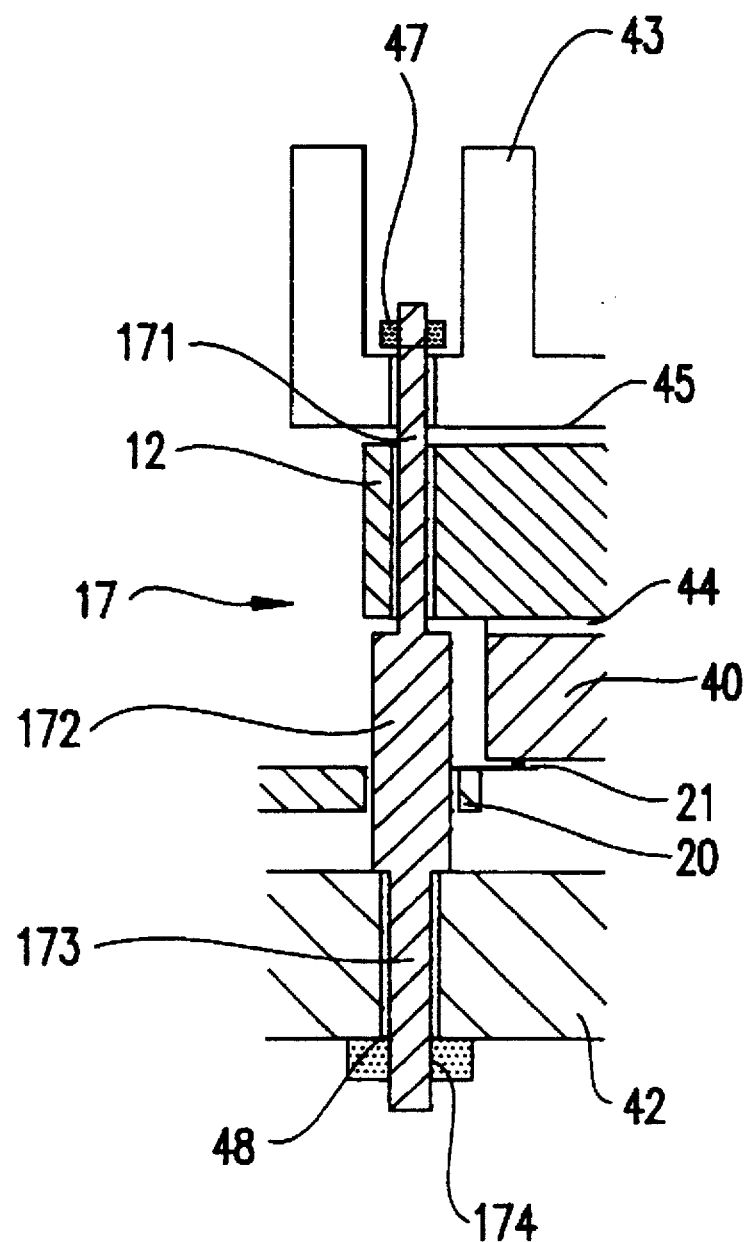
FIG. 13 shows the structure of an electronic package according to a fifth embodiment of the present invention.

Referring to FIG. 13, in the fifth embodiment, each of the pins 17 has a first portion 171, a second portion 172, and a third portion 173 whose diameters are approximately 1.2 mm, 1.6 mm, and 0.7 mm, respectively. The length of the second portion 172 is approximately 0.8 mm. The pins 17 are preferably made of stainless steel. The third portion 173 is threaded.

In the substrate 42, holes 48 are bored having a 0.8 mm diameter. The third portions 173 of the pins 17 are inserted into the holes 48 of the substrate 42. The pins 17 are fixed to the substrate 42 by tightening nuts 174 threaded on the pins 17.

Thus, in addition to the features of the third embodiment, the fifth embodiment has the following features. A first feature is that the pins 16 can be positioned precisely.

Another feature is that the strength of the joint between the pins 16 and the substrate 42 can be enhanced.

Next is described the sixth embodiment of the present invention. A feature of the sixth embodiment is a modification of means for joining the lower legs 11 or pins to the substrate 42. The other structures and functions are the same or similar to those of the third embodiment.

Figure 14:
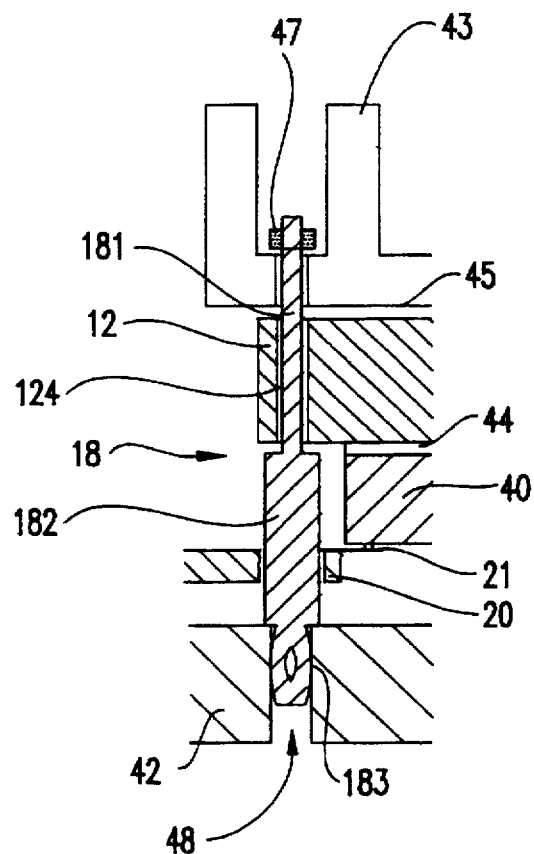
FIG. 14 shows the structure of an electronic package according to a sixth embodiment of the present invention.

Referring to FIG. 14, in the sixth embodiment, pins 18 have a first portion 181, a second portion 182, and a press-fitting spring 183. The configuration of the first portion 181 is the same as that of the third embodiment.

Figure 15A:
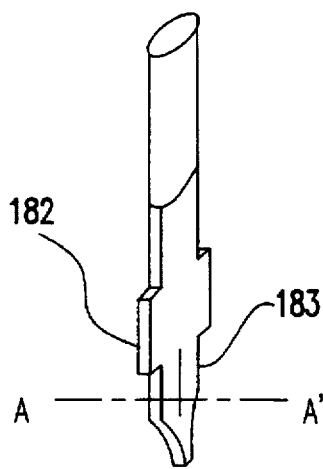
FIGS. 15(a)–15(c) show the detailed structure of a pin 18 shown in FIG. 14.

Referring to FIG. 15(a), the second portion 182 is a plate whose length is approximately 0.8 mm. The width of the second portion 182 is greater than the diameter of the holes 48 of the substrate 42 and the diameter of the holes 124 of the plate 12.

Figure 15B:
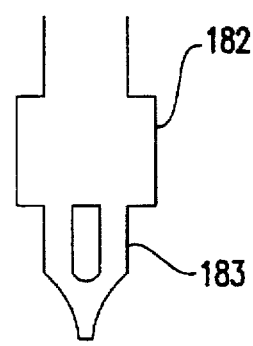
Figure 15C:
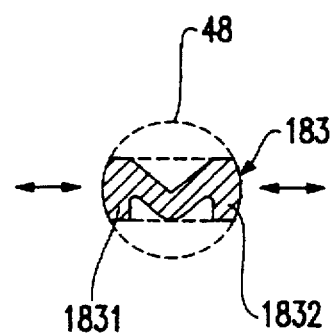

Referring to FIG. 15(b), the spring 183 has a tapered end. Referring to FIG. 15(c), the cross-section of the spring 183 is M-shaped. The spring 183 has resiliency in the direction indicated by the arrows. When the spring 183 is inserted in the holes 48 of the substrate 42, the spring 183 tightly fits (press-fitted) in the holes 48 to fix the pin 18 to the substrate 42.

Thus, in addition to the features of the third embodiment, the sixth embodiment has the feature that the pins 18 can easily be fixed to the substrate 42.

Next is described the seventh embodiment of the present invention. A feature of the seventh embodiment is that the plate 12 is made wider to cover the tape carrier 20.

Figure 16:
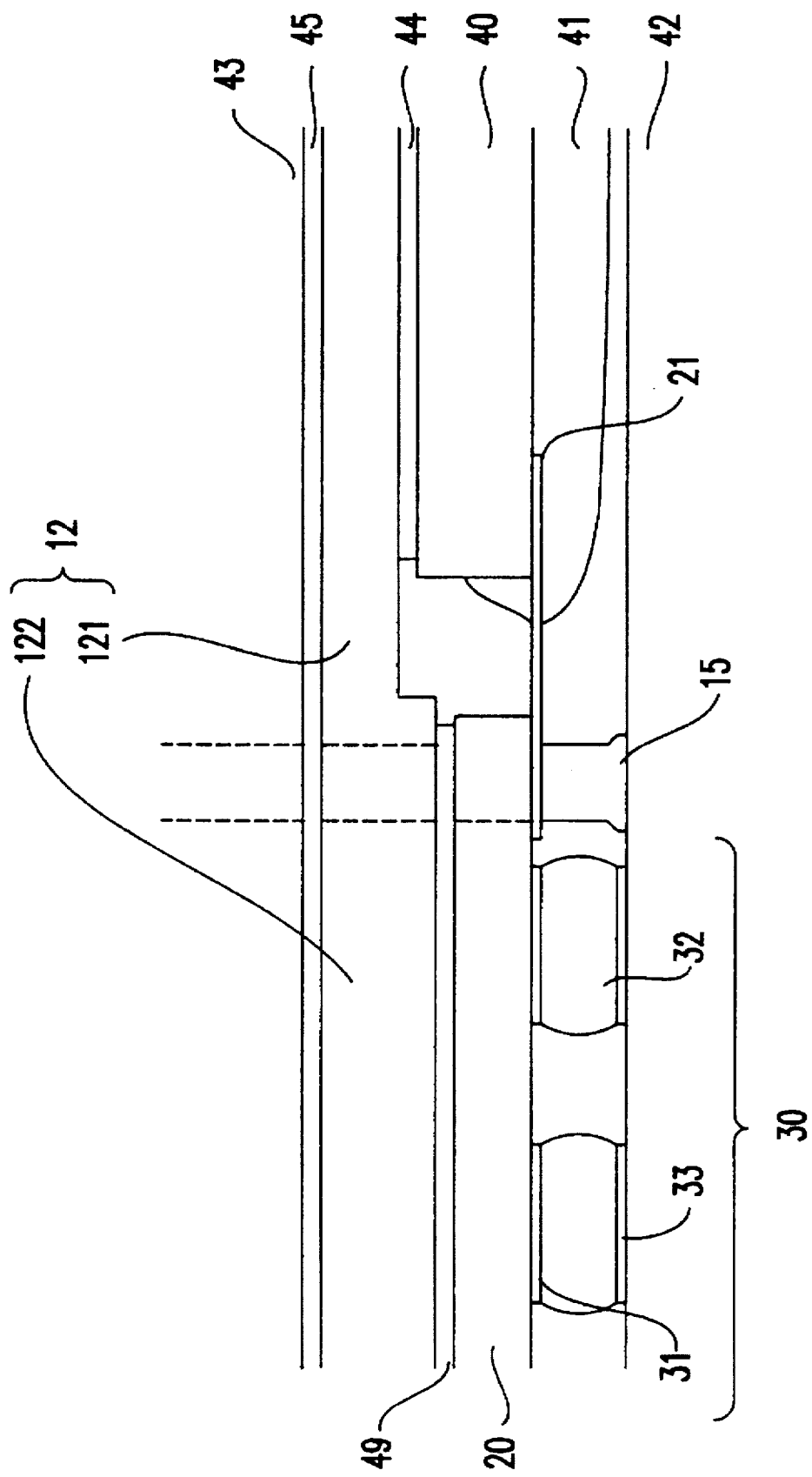
FIG. 16 shows the structure of an electronic package according to a seventh embodiment of the present invention.

Referring to FIG. 16, in the seventh embodiment, the plate 12 has a first portion 121 and a second portion 122 which cover the LSI chip 40 and the tape carrier 20, respectively. The LSI chip 40 is attached to the lower face of the first portion 121 by the adhesive 44. The tape carrier 20 is attached to the lower face of the second portion 122 by an adhesive 49. The material of the adhesive 49 is the same as that of the adhesive 44.

The tape carrier 20 and the substrate 42 are connected via the connecting structure 30 used in the first embodiment. The connecting structure 34 used in the second embodiment cannot be used in the seventh embodiment because the upper surface of the tape carrier 20 is covered with the second portion 122 of the plate 12.

Next is described the assembling process of the seventh embodiment.

Figure 17A:
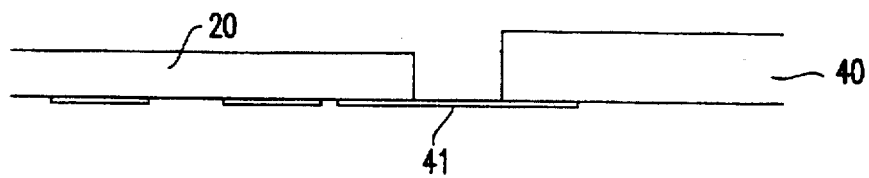
FIGS. 17(a)–17(e) show steps of the assembling process of the electronic package shown in FIG. 16.

Referring to FIG. 17(a), in step 1, the LSI chip 40 is connected to the inner leads 21 of the tape carrier 20.

Figure 17B:
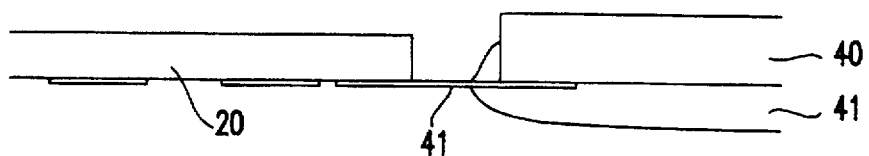

Referring to FIG. 17(b), in step 2, the lower surface of the LSI chip 40 is encapsulated by the resin 41.

Figure 17C:
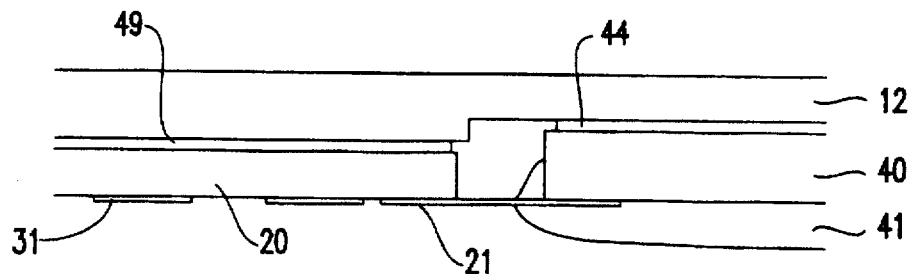

Referring to FIG. 17(c), in step 3, the adhesive 44 is distributed over the lower face of the first portion 121 of the plate 12 or over the upper surface of the LSI chip 40. The adhesive 49 is distributed over the lower face of the second portion 122 of the plate 12 or over the upper face of the tape carrier 20. Thereafter, the LSI chip 40 and tape carrier 20 are attached to the first portion 121 and the second portion 122 of the plate 12, respectively. The adhesive is cured at a temperature of approximately 150° C. for about 10 minutes.

Figure 17D:
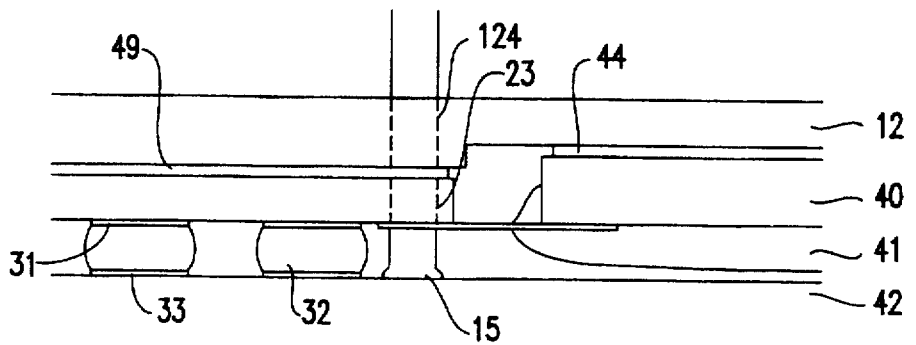

Referring to FIG. 17(d), in step 4, pins 15 are inserted into the respective holes 23 of the tape carrier 20 and into the respective holes 124 of the plate 12. Thereafter, the pads 31 and the pads 33 are joined by soldering.

Figure 17E:
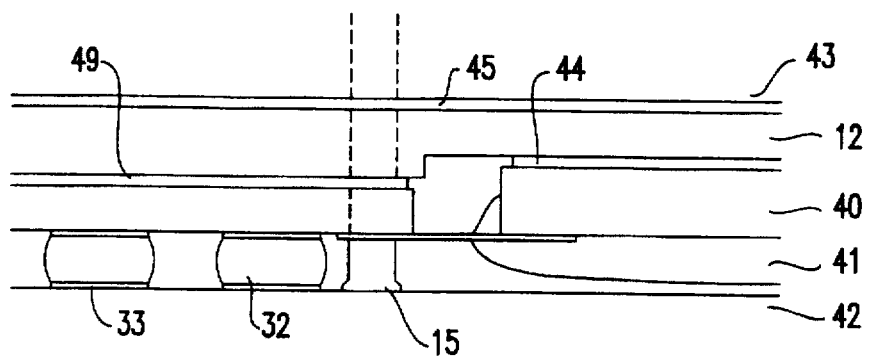

Referring to FIG. 17(e), in step 5, the heat sink 43 is attached onto the plate 12.

In the seventh embodiment, the heat sink 43 thermally contacts the second portion 122 of the plate 12 as well as the first portion 121. Therefore, the thermal resistance between the plate 12 and the heat sink 43 is reduced. Furthermore, the second portion 122 of the plate 12 prevents the tape carrier 20 from warping.

Next is described the eighth embodiment of the present invention. A feature of the eighth embodiment is boring holes in the second portion 122 of the plate 12 to adapt the connecting structure 34 thereto.

Figure 18:
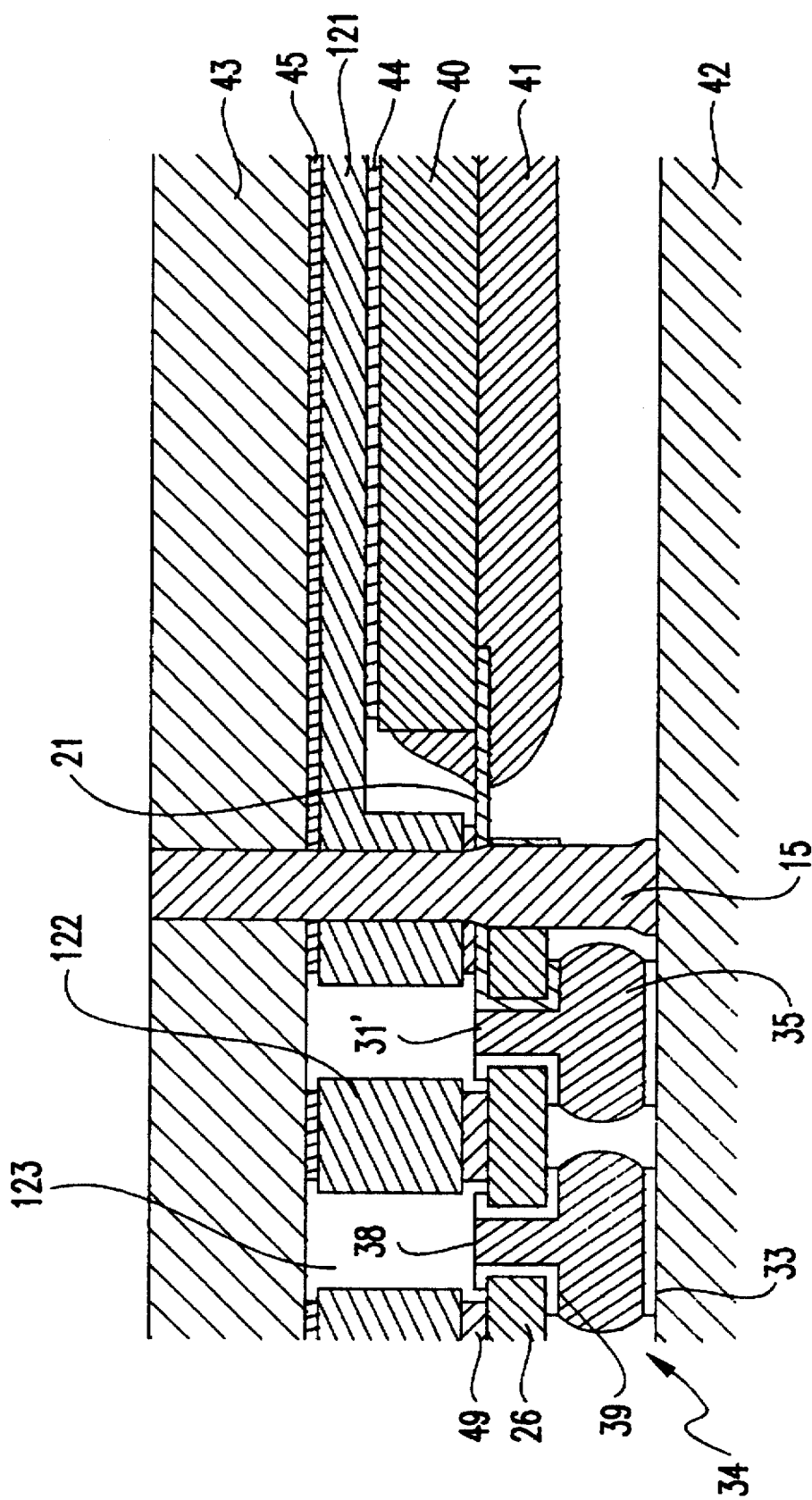
FIG. 18 shows the structure of an electronic package according to the eighth embodiment of the present invention.

Referring to FIG. 18, tape carrier 20 and the substrate 42 are connected by the connecting structure 34 used in the second embodiment. Holes 123 are bored in the second portion 122 of the plate 12. Each of the holes 123 is positioned over the corresponding one of the pads 31' of the connecting structure 34. The holes 123 make visible the solder 35 which appears at the upper surface of the tape carrier 20.

Thus, in addition to the features of the seventh embodiment, the eighth embodiment has the feature that a faulty or failed connection between the tape carrier 20 and the substrate 42 can easily be detected.

Next is described a ninth embodiment of the present invention. The feature of the ninth embodiment is a modification of the pad 31' of the second embodiment shown in FIGS. 7 and 8. Furthermore, structures for easy soldering are added to the tape carrier 20' and the substrate 42. Other structures and functions are the same as those of the second embodiment.

Figure 19:
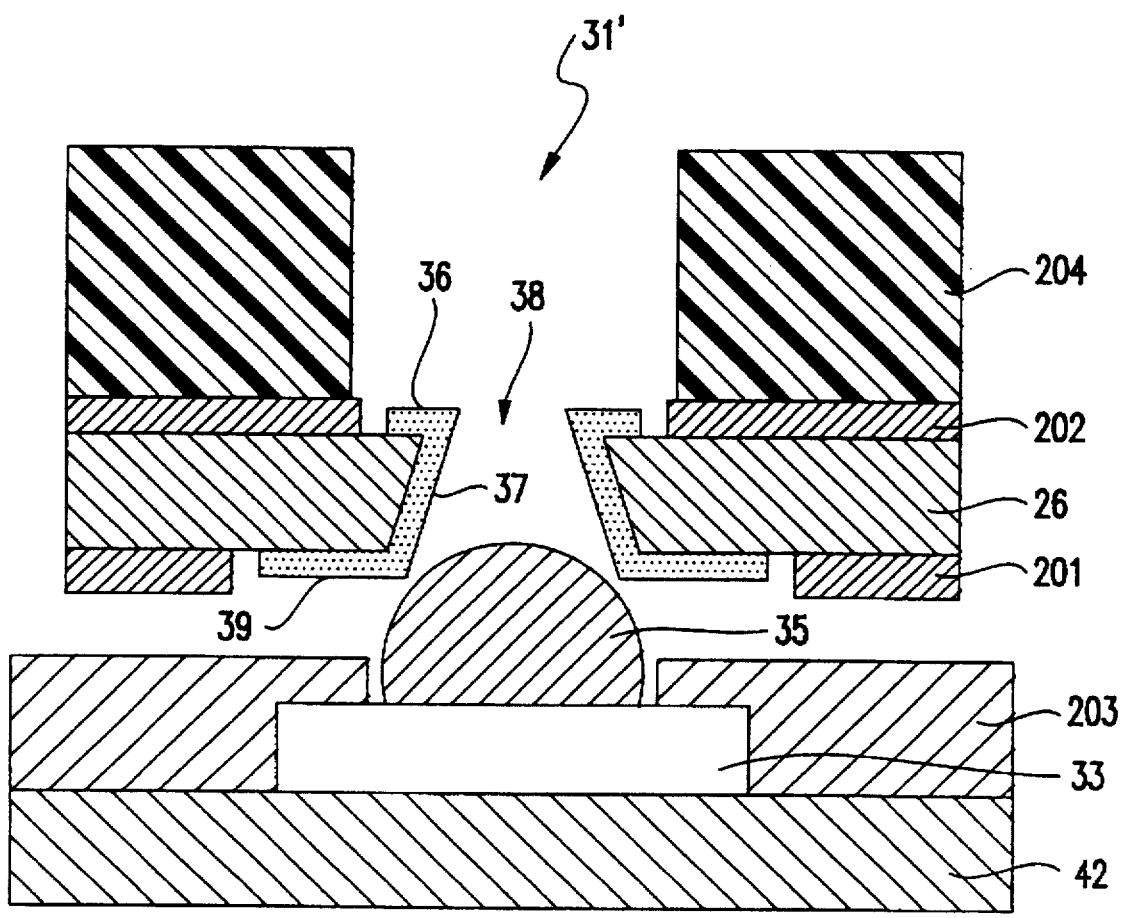
FIG. 19 shows the connecting structure according to the ninth embodiment of the present invention before soldering.

Referring to FIG. 19, in addition to the structure shown in FIG. 8(b), solder resists 201, 202, and 203 are coated on the upper surface of the film 26, the lower surface of the film 26, and the upper surface of the substrate 42, respectively. The solder resists 201, 202, and 203 surround the conductor pattern 36, the conductor pattern 39, and the pad 33, respectively.

A stiffener 204 having holes is attached to the upper surface of the film 26 via the solder resist 202. The stiffener is preferably made of an epoxy resin. Each of the holes of the stiffener 204 opens to the corresponding pad 31'.

Figure 20:
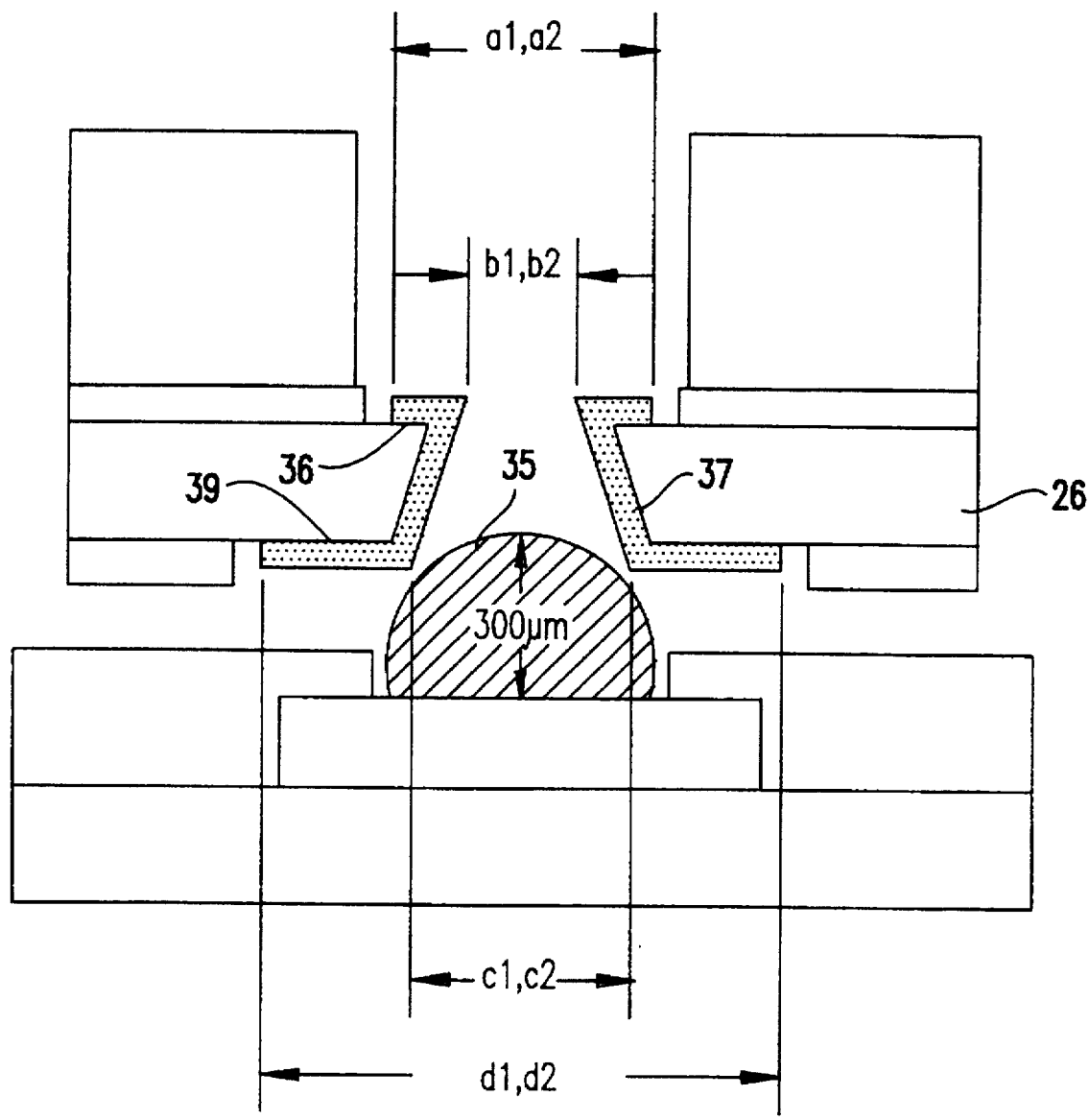
FIGS. 20–22 show the dimensions of the connecting structure shown in FIG. 19.
Figure 21:
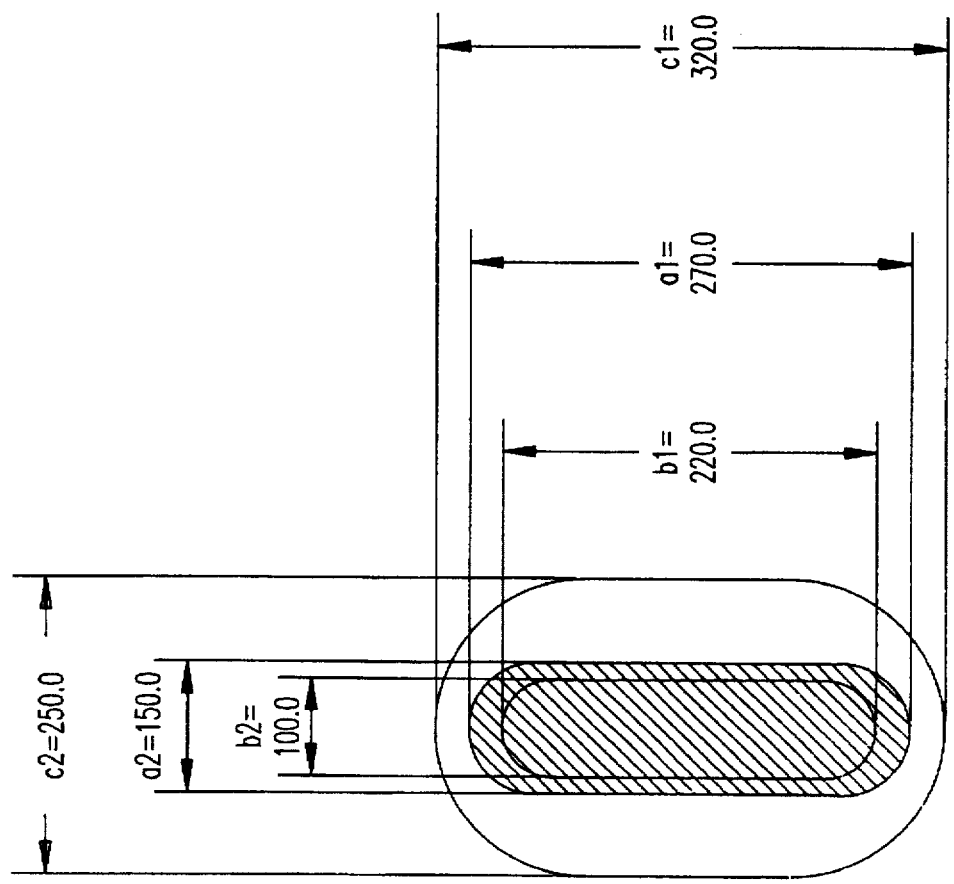

Referring to FIGS. 20 and 21, the through-hole 38, the conductor pattern 36, and the conductor pattern 39 are elliptically shaped.

Of course the holes may have other suitable shapes depending on the designer's parameters and constraints.

The length of the major axis a1 and the length of the minor axis a2 of the conductor pattern 36 are in the exemplary embodiment approximately 270.0 µm and 150 µm, respectively.

The length of the major axis b1 and the length of the minor axis b2 of the through-hole 38 on the upper surface of the film 26 in the exemplary embodiment are approximately 220.0 µm and 100 µm, respectively.

The length of the major axis c1 and the length of the minor axis c2 of the through-hole 38 on the lower surface of the film 28 in the exemplary embodiment are approximately 320.0 µm and 250 µm, respectively.

Of course dimensions the above (and those mentioned below) are merely exemplary and the dimensions are scalable according to the designer's requirements.

Figure 22:
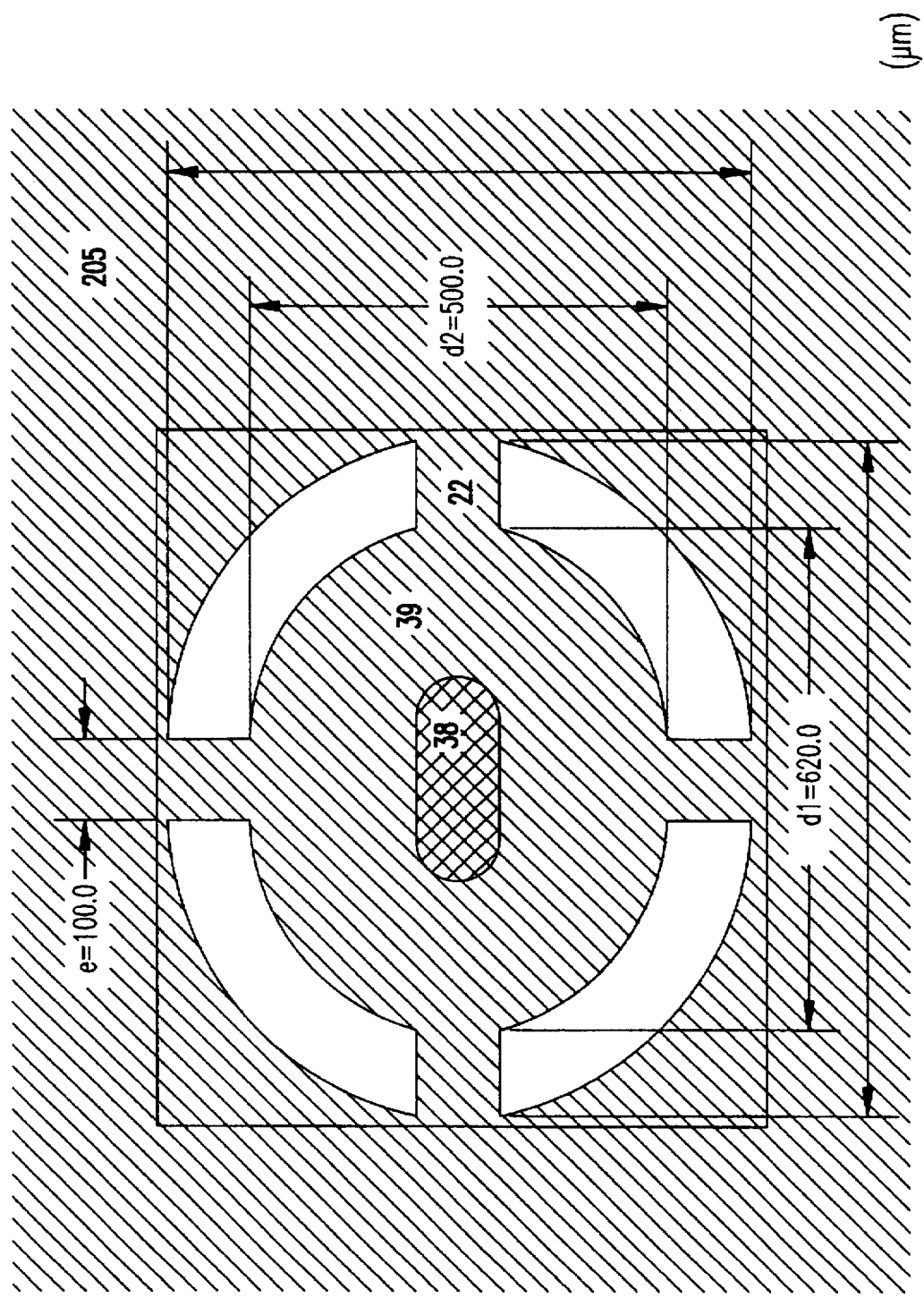

Referring to FIGS. 20 and 22, the length of the major axis d1 and the length of the minor axis d2 of the conductor pattern 39 are approximately 270.0 µm and 150 µm, respectively.

The conductor pattern 39 is connected to a ground pattern 205 via the wiring 22 having a width of 100.0 µm.

Referring again to FIG. 20, the height and the volume of the solder 35 are approximately 300 µm and $0.6 \times 10^{10}$ mm$^3$.

Figure 23:
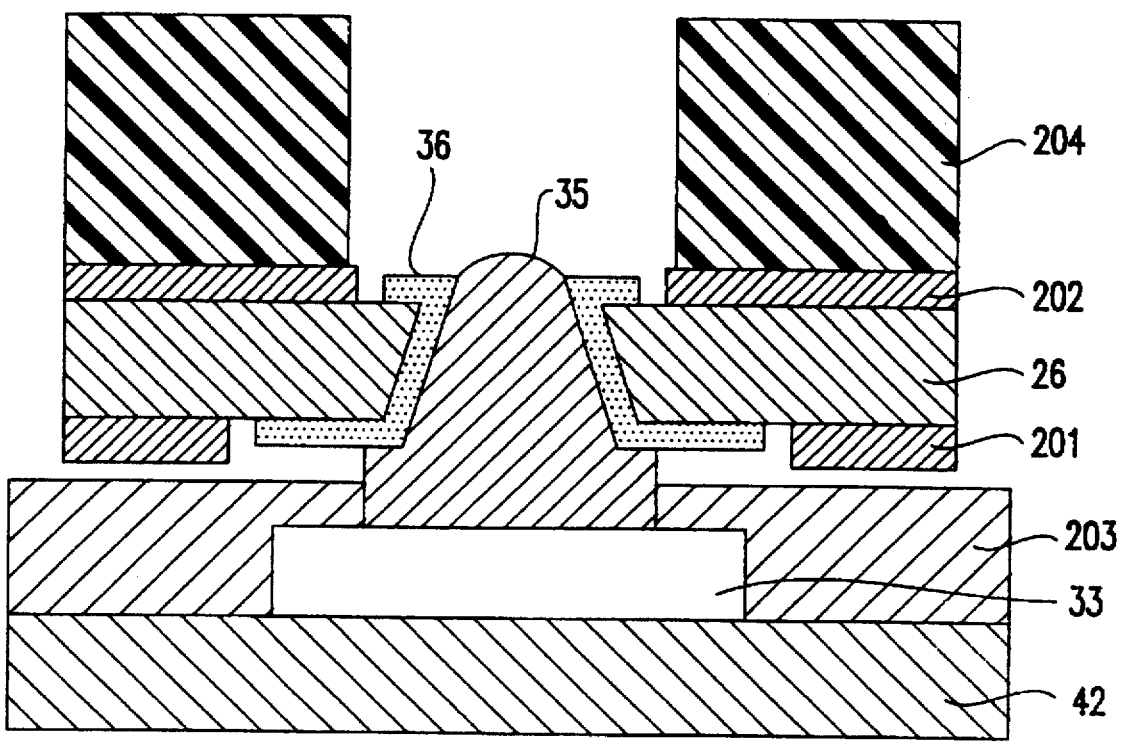
FIG. 23 shows the connecting structure shown in FIG. 19 after soldering.

Referring to FIG. 23, during a connecting process, the solder 35 is heated. By heating, the solder 35 melts to travel or flow upwardly into the through-hole 38. This process is substantially the same as that shown in FIGS. 8(a)–8(c). If necessary, the film 26 may be slightly pressed against the substrate 42 to enhance the flow of the solder 35.

Next is described modifications of the aforementioned embodiments of the present invention.

First, the application of the present invention is not limited to the LSI chip 40. The present invention can be applied to any type of electronic device.

Secondly, the cross-section of the bottom legs and the pins can be formed in a variety of shapes. For example, the cross-section may be rectangularly-shaped. The holes 23 of the tape carrier 20 must be shaped to fit the bottom legs and the pins.

Thirdly, the number and configuration of the upper legs, bottom legs, and pins are not limited to those of the aforementioned embodiments.

Fourthly, the heat sink 43 may be coated with insulating material (e.g., epoxy or silicone) to avoid short-circuiting among the inner leads 21.

Fifth, the present invention can be applied to any type of cooling means other than the heat sink 43.

The present embodiments are therefore, to be considered in all respects as illustrative and not restrictive, the scope of the invention being indicated by the appended claims rather than by the foregoing description and all changes which come within the meanings and range of equivalency of the claims are therefore intended to the embraced therein.

What is claimed is:

1. A process for connecting electronic devices, comprising steps of:

(a) preparing a first substrate having a first surface, a second surface, and a through-hole therebetween;

(b) preparing a second substrate having a first surface, a second surface, and a pad on said first surface of said second substrate;

(c) providing a solder on said pad of said second substrate;

(d) positioning said through-hole of said first substrate on said solder, said second surface of said first substrate and said first surface of said second substrate opposing one another;

(e) heating said solder to flow said solder into said through-hole of said first substrate and to protrude said solder from said through-hole of said first substrate, to couple said first substrate to said second substrate; and (f) confirming one of an appearance of said solder on said first surface of said first substrate and whether at least a portion of said solder is protruding from said through-hole of said first substrate, thereby to judge a connection condition of said second surface of said first substrate to said first surface of said second substrate.

2. A process according to claim 1, wherein said step (a) comprises a step of:

(a-1) tapering said through-hole.

3. A process according to claim 1, wherein said step (a) comprises a step of:

(a-2) forming a first conductive pattern on a surface of said through-hole.

4. A process according to claim 1, wherein said step (a) comprises a step of:

(a-3) forming a second conductor pattern surrounding said through-hole on said second surface of said first substrate, said second conductor pattern being adjacent to said through-hole.

5. A process according to claim 4, wherein said step (a) comprises a step of:

(a-4) providing a first solder resist surrounding said second conductor pattern on said second surface of said first substrate.

6. A process according to claim 1, wherein said step (a) comprises a step of:

(a-5) forming a third conductor pattern surrounding said through-hole on said first surface of said first substrate, said second conductor pattern being adjacent to said through-hole.

7. A process according to claim 4, wherein said step (a) comprises a step of:

(a-6) providing a second solder resist surrounding said third conductor pattern on said first surface of said first substrate.

8. A process according to claim 1, wherein said step (b) comprises a step of:

(b-1) providing a third solder resist surrounding said pad on said first surface of said second substrate.

9. A process according to claim 1, wherein said first substrate comprises a film.

10. A process according to claim 1, wherein a diameter of said through-hole is from 100 µm to 220 µm on said first surface of said first substrate.

11. A process according to claim 1, wherein a diameter of said through-hole is from 250 µm to 320 µm on said second surface of said first substrate.

12. A process according to claim 4, wherein a diameter of said second conductor pattern is from 500 µm to 620 µm.

13. A process according to claim 6, wherein a diameter of said third conductor pattern is from 150 µm to 270 µm.

14. A process according to claim 1, wherein said step (e) comprises a step of:

(e-1) pressing said first substrate against said second substrate.

* * * * *